350-432 SR
XR 3,815,993

United States Pa

Tarabocchia

3,815,993 une 11, 1974

[54] LIGHT PROJECTION APPARATUS AND METHOD FOR PHOTOPRINTING

[76] Inventor: Martin Tarabocchia, 14710 Dunbar Ln., Woodbridge, Va. 22191

[22] Filed: Feb. 15, 1972

[21] Appl. No.: 226,433

[52] U.S. Cl. .................... 355/78, 350/189, 355/132
[51] Int. Cl. ........................................ G03b 27/02
[58] Field of Search ...........355/71, 77, 78, 19/132; 350/189, 45; 250/86, 65

[56] References Cited

UNITED STATES PATENTS

| | | | |
|---|---|---|---|
| 3,295,407 | 1/1967 | Jeffree | 350/189 |
| 3,334,543 | 8/1967 | Perner et al. | 355/71 |
| 3,573,456 | 4/1971 | Beeh | 355/71 X |
| 3,697,178 | 10/1972 | Douglas | 355/77 |

*Primary Examiner*—Samuel S. Matthews
*Assistant Examiner*—Richard A. Wintercorn
*Attorney, Agent, or Firm*—Cooper, Dunham, Clark, Griffin & Moran

[57] ABSTRACT

Light projection apparatus and method for illuminating a mask in the photoprinting of a photosensitive material. A light source produces a light of a desired frequency range. A condensing lens system is utilized to produce a region of substantially collimated light, and an objective lens system projects an image of an imaginary surface of that region to illuminate the mask. The mask may be in or out of contact with the photosensitive material.

18 Claims, 3 Drawing Figures

3815993
OR IN 355/78

LIGHT PROJECTION APPARATUS AND METHOD FOR PHOTOPRINTING

BACKGROUND AND BRIEF DESCRIPTION OF THE INVENTION

This invention relates to the photoprinting of photosensitive material, and has particular application to the duplication of high resolution microminiature images from a mask onto a photosensitive substrate such as a photosensitive wafer. The invention is particularly directed to providing a high resolution system for projecting light in the exposure of a photosensitive substance and utilizing little or no contact between the photosensitive substance and the mask that is used for selective illumination of the photosensitive substance.

Active areas in solid state devices are generally formed by etching patterns into an oxide layer on the surface of a semiconductor material. The patterns are formed through use of a photosensitive material commonly termed "photoresist." The photoresist is exposed typically by contact printing through use of a photomask. However, because of physical contact between the photomask and photosensitive material, damage to both surfaces often results.

Accordingly, it is desirable to expose photosensitive material with little or no contact between the material and the photomask and without appreciable loss of resolution. The present invention achieves such high resolution exposure of photosensitive material with little or no contact with the photomask by use of a novel light projection system and method. An objective lens system is employed in conjunction with a condensing lens system, not for the purpose of projecting an image of a photomask, as has been the case in the prior art, but rather for the purpose of projecting an image of an imaginary surface illuminated by substantially collimated light. Through use of the novel optical system herein, light is not collimated throughout the entire image field (from the front surface of the objective lens system to the photosensitive material). The disadvantage of collimated light throughout the entire image field is spacial noise, i.e., shadows of most dust particles and inhomogeneities of the glass forming the lenses are introduced onto the photosensitive material. Such undesired shadows result in defects in the microcircuit that is being produced, for example.

The following patents are representative of the prior art:

| U.S. Pat. No. | Patentee(s) | Issued |
|---|---|---|
| 2,063,312 | Hopkins | Dec. 8, 1936 |
| 2,338,671 | Shull | Jan. 4, 1944 |
| 2,510,419 | Ross | June 6, 1950 |
| 2,959,099 | Billard et al. | Nov. 8, 1960 |
| 3,010,367 | Miles | Nov. 28, 1961 |
| 3,334,543 | Perner et al. | Aug. 8, 1967 |
| 3,490,846 | Kasper | Jan. 20, 1970 |
| 3,103,849 | Wise | Sept. 17, 1963 |
| 3,295,407 | Jeffree | Jan. 3, 1967 |
| 3,566,763 | Knopf | Mar. 2, 1971 |
| 3,596,083 | Lovering | July 27, 1971 |
| 3,610,750 | Lewis et al | Oct. 5, 1971 |

Foreign Patents

Austrian Patent No. 138,834, issued 1934
Canadian Patent No. 589,806, issued Dec. 29, 1959, patentee — Craig.

The invention will be more completely understood by reference to the following detailed description, which is to be read in conjunction with the appended drawings.

DETAILED DESCRIPTION

Figure 1:
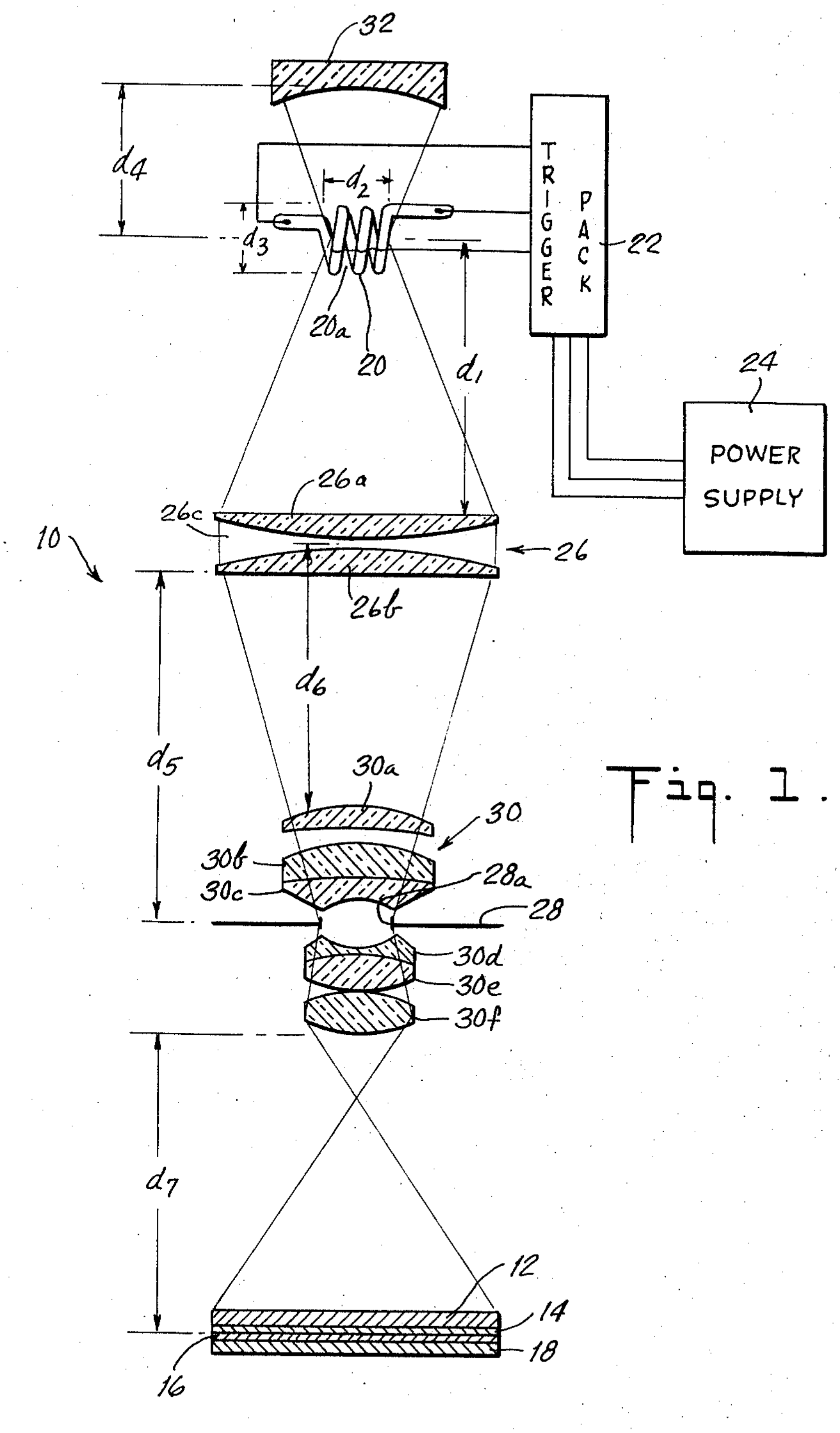
FIG. 1 is a schematic view of a representative but presently preferred light projection system embodying the invention.

Referring to FIG. 1, a light projection system 10 is shown for illuminating a photomask 12 used in the production of microminiature images (lines about 0.00005 inch in width) on a photosensitive layer 14 (termed "photoresist") deposited over oxide alyer 16 that is part of a silicon wafer 18. A light source means 20, typically constituted by a Xenon helical lamp (advantageously General Electric Type FT 506), is used as a source of illumination. The light is energized by circuitry 22 shown only in block diagram form and designated "trigger pack" and by power supply 24, also shown in block diagram form. The lamp 20 produces light of a desired frequency range useful in exposing the photoresist 14. A filter (not shown) may be used to select desired discrete wavelengths of light if a non-achromatic objective (see below) is utilized in the system. The lamp 20 may be energized to provide a flash of light one or more times, as desired, in the exposing of the photoresist. Each flash of the lamp occurs in a fraction of a second, thereby eliminating the need of a shutter in the light projection system.

Light generated by the lamp 20 is collected by a condensing lens system 26. This lens system may be formed from two condensing lenses **26*a* and 26*b*, advantageously made of fused silica (quartz) which is highly transmitting in the ultraviolet region of the spectrum, i.e., highly transmitting in the frequency range of light principally absorbed by the photosensitive layer 14. The lamp 20 is advantageously positioned so that its center is located at the primary focal point of the first condensing lens 26*a*. An image of the light source is formed by the condensing lens 26*a* at infinity. An identical condensing lens 26*b* is positioned adjacent to the condensing lens 26*a*. The condensing lens 26*b* utilizes the image of the light source formed at infinity as the object and images it on its primary focal plane designated 28 in FIG. 1.**

Also included in the light projection system 10 is an objective lens system 30 (achromatic or non-achromatic) composed of components **30*a* (positive meniscus), 30*b* and 30*c* (achromatic meniscus doublet), 30*d* and 30*e* (achromatic meniscus doublet) and 30*f* (double convex). The limiting aperture of the objective lens system is1located at the primary focal plane of the second condensing lens 26*b*. The limiting aperture is designated 28*a* in FIG. 1. The objective lens system 30** is substantially corrected for most aberrations, i.e., spherical aberration, coma, astigmatism, curvature of field and chromatic aberration (in the event the objective is achromatic) or corrected for discrete desired wavelengths in the event the object is not achromatic.

The condensing lens system 26 forms an image of the light source 30 in the limiting aperture 28*a* so that the light source just barely fills the limiting aperture. In this regard it should be noted that the condensing lens system, because of its symmetry and the object to image distance ratio, has a magnification ratio of 1:1. By just barely filling the limiting aperture 28*a* with an image of the light source 20, optimum use is made of the available light. Also, by just barely filling the limiting aperture, the illumination from the objective lens system 30 may be considered partially coherent.

The objective lens system 20 images a region 26*c* that is located between the condensing lens 26*a* and 26*b* onto the plane of the photoresist 14. While the depth of focus of the objective lens system 30 may be such that all parts of the condensing lens system, including its outer surfaces and regions adjacent thereto, appear to be in focus on the photoresist layer 14, it is believed that an image of an imaginary surface in the region of 26*c* is the most desirable to be projected because light within this region is the most collimated. On the otherhand, through use of the objective lens system 30, light from that system throughout the image field thereof is not collimated. The use of non-collimated light in this part of the overall lens system is desirable to avoid the production of shadows of dust particles and inhomogeneities in the lenses onto the photoresist layer 14.

The system of FIG. 1 includes a reflector 32 (typically a spherical mirror) which images the lamp 20 onto itself, with the image slightly displaced so that the spaces 20*a* between the helical turns of the lamp are filled with light to improve efficiency and uniformity of light at the photoresist plane 14.

Figures 2, 3:
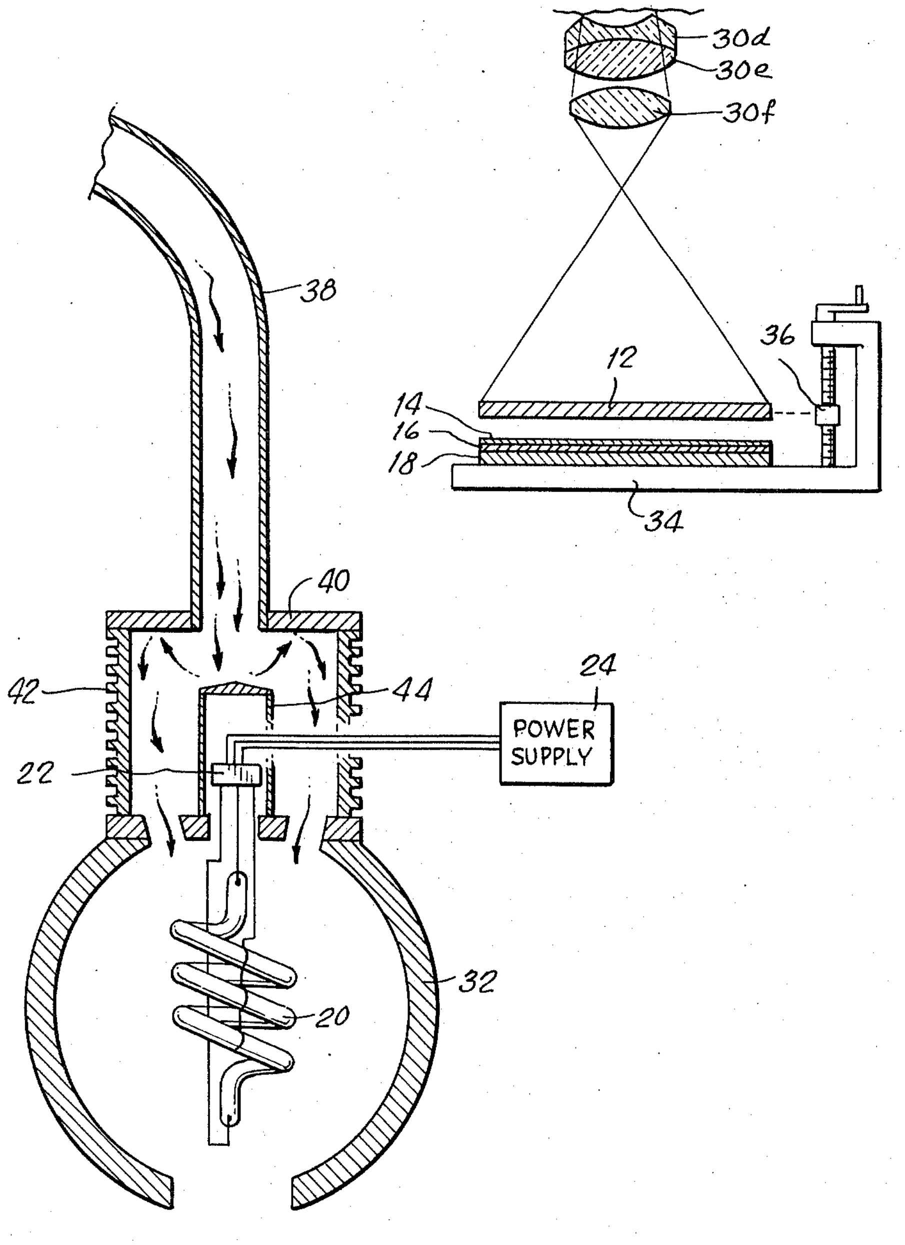
FIG. 2 is a schematic view of a wafer and photomask positioning mechanism useful in the system of FIG. 1.
FIG. 3 shows a light source support and cooling system useful in the system of FIG. 1.

As shown in FIG. 1, the photomask 12 is positioned against the photoresist layer 14. FIG. 2 shows a system (schematically illustrated) for positioning the mask with respect to the wafer that contains the photoresist layer 14. Only the lens components 30*d*, 30*e* and 30*f* have been shown in FIG. 2 that form a part of the system of FIG. 1, inasmuch as there is no change in the light projection system. A holder 34 may be employed upon which the wafer is positioned. A screw-adjusting mechanism 36 (or any other suitable adjustment means) is used to position the photomask 12 with respect to the photoresist layer 14. The photomask 12 may be positioned lightly against the photoresist layer 14, as shown in FIG. 1, or the photomask 12 may be positioned adjacent to but out of contact with respect to the photoresist layer 14. It has been found that contact between the photomask 12 and the photoresist layer 14 need not take place, and a proximity or out-of-contact printing technique may be employed without significant loss of resolution and with a minimum production of difraction fringes.

FIG. 3 shows the details of a light source support and cooling system useful in the system shown schematically in FIG. 1. Like reference numerals have been used in FIG. 3 to designate the components from FIG. 1. An air hose 38 is attached to a disc 40 (preferably Teflon) that is in turn attached to a finned housing 42. Within the housing 42 is a secondary housing 44 that contains the electronic circuitry 22 used to energize the lamp 20. The housing 44 may be a thin aluminum shell, for example. Air flow from the hose 38 is directed about the housing 44 to cool it and the circuitry therein, as well as the lamp 20.

As an example of a representative but presently preferred embodiment of the light projection system as shown in FIG. 1, the lamp 20 is a Xenon helical lamp of G.E. type FT 506 one inch long (distance *d*2 in FIG. 1) and of a diameter 0.75 inch (diameter *d*3 in FIG. 1) The center of the lamp is located 2 inches from the spherical reflector 32 in FIG. 1 (distance *f*4), and the radius of the reflector is 2 inches. The reflector images the lamp 20 onto itself at a 1:1 magnification ratio, with the image slightly displaced so that the spaces 20*a* between the helical terms of the lamp are filled with light. This increases light output by 40 percent and improves the uniformity of light at the photoresist plane 14. The condensing lenses 26*a* and 26*b* are identical as to material, focal length and radius, and the condensing lens system 26 is corrected for spherical aberration. Each is a plano-convex lens of 5.25 inches focal length, having a curved surface whose radius is 2.4 inches. The center of the lamp 20 is located a distance (*d*1 in FIG. 1) of 5 inches from the flat surface of the condensing lens 26*a*, thereby making the object distance of the condensing lens system 26 equal to 5.25 inches, equivalent to the focal length of condensing lens 26*a*. The condensing lens 26*a* images the lamp at infinity, thereby forming a collimated light region between condensing lenses 26*a* and 26*b*. The primary focal point of the condensing lens 26*b* is located 5 inches from the flat surface of the condensing lens 26*b* (distance *d*5 in FIG. 1) so that it falls in the plane of the limiting aperture 28*a* of the objective lens system 30. The condensing lens 26b images the lamp on its primary focal point, thereby making the image distance of the condensing lens system 26 equal to 5.25 inches. Through these parameters the lamp is imaged on the limiting aperture 28*a* at a 1:1 magnification ratio. The objective lens system is achromatic and Bosch and Lomb, Baltar motion picture projection lens Type No. 51-17-56 having an equivalent focal length of 74.9 mm., an *f*-number of *f*/2.3, back focal distance of 56.3 mm., a telephoto ratio of 0.75, a front operating aperture of 36.0 mm., a rear operating aperture of 26.7 mm., a one-half angular coverage of 11.7°, a front clearance angle of 11.0° (maximum), and a rear clearance angle of 2.2° (maximum). The limiting aperture in this lens system (equivalent focal length divided by the *f*-number) has been calculated to be 32.6 mm. The distance between an imaginary surface in the collimated light region 26*c* and the front surface of the first lens element 30*a* (distance *d*6 in FIG. 1) is 4.7 inches, thereby making the object distance of the projection lens system 30 equal to 6.0 inches. The distance between therear surface of the achromatic objective lens system (the outer surface of lens element 30*f*) and the photoresist layer 14 (distance *d*7 in FIG. 1) is 5.3 inches, thereby making the image distance of the projection lens system 30 equal to 6 inches. Through these parameters, the imaginary surface located in the region 26*c* is imaged at a 1:1 magnification ratio on the photoresist layer 14.

A typical photoresist is "Waycoat" that is a negative photoresist manufactured by Philip A. Hunt Chemical Corporation of Palisades Park, New Jersey. Another typical photoresist is Kodak Thin Film Resist made by Eastman Kodak Company, Rochester, New York.

While the above example of a specific light projection system has been given, it is to be understood that the invention is not limited to this specific system.

In the light projection system of FIG. 1, it should be noted that the objective lens system 30 projects an image of an imaginary plane that is located somewhere in the vicinity of the condensing lens system 26. The region 26*c* between the two condensing lenses 26*a* and 26*b* is, as noted, that region which contains collimated light. In the nearby vicinity, i.e., in the region within the condensing lenses 26*a* or 26*b* or slightly in front of the condensing lens 26*b*, the light is slightly decollimated. It is a projection of an imaginary surface in this collimated or slightly decollimated light region, i.e., a region of substantially collimated light, that is achieved by the objective lens system 30, thereby producing non-collimated light in the image field. As noted above, the objective lens system 30 does not project an image of a photomask as is typically the case with prior art image projection systems used to project an image upon a photosensitive medium.

Accordingly, the invention should be taken to be defined by the following claims.

I claim:

1. Light projection apparatus for illuminating a mask having selected light absorbing regions and which mask is positioned against or adjacent to a photosensitive material to illuminate selected portions of the material, comprising:

a light source means for producing light of a desired frequency range;

b condensing lens means for collecting light from said light source means; and c objective lens means for projecting light from said condensing lens means to illuminate said mask, said objective lens means imaging a region substantially within said condensing lens means onto said photosensitive material.

2. Apparatus according to claim 1, in which said light source means comprises a Xenon flash lamp.

3. Apparatus according to claim 1, in which said objective lens means includes a limiting aperture which is located substantially in the region where said condensing lens means forms a real image of said light source means.

4. Apparatus according to claim 3, in which the real image of said light source means substantially just fills said limiting aperture.

5. Apparatus according to claim 1, in which said objective lens means includes a limiting aperture which is located substantially in the region where said condensing lens means forms a real image of said light source means.

6. Apparatus according to claim 1, in which said condensing lens means comprises first and second condensing lenses, said first condensing lens being positioned so that said light source means is located at the primary focal point thereof and which forms an image at infinity, said second condensing lens being positioned adjacent to said first condensing lens and being substantially identical to said first condensing lens to form a real image in a magnification ratio of 1:1 at the primary focal point of the second condensing lens.

7. Apparatus according to claim 6, in which said objective lens means includes a limiting aperture located substantially at the primary focal plane of said second condensing lens.

8. Apparatus according to claim 7, in which the real image of said light source means substantially just barely fills said limiting aperture.

9. Apparatus according to claim 8, in which said objective lens means images a region substantially between said first and second condensing lenses onto said photosensitive material.

10. Apparatus according to claim 9, in which the objective lens means images said region onto said photosensitive material at a magnification ratio of substantially 1:1.

11. Apparatus according to claim 10, in which said light source means comprises a Xenon flash lamp of helical shape.

12. Apparatus according to claim 11, including a reflective mirror positioned on the side of said flash lamp opposite from said first condensing lens for reflecting light emitted by said flash lamp into the spaces between the helical turns of said flash lamp.

13. Apparatus according to claim 12, in which said objective lens means comprises an achromatic objective lens system.

14. Apparatus according to claim 13, including a mask, a photosensitive wafer, and means for holding said mask and wafer for illumination by light from said achromatic objective lens system.

15. Apparatus according to claim 14, in which said holding means is for positioning said mask against said wafer.

16. Apparatus according to claim 14, in which said holding means is for positioning said mask adjacent to but out of contact with said wafer.

17. Light projection apparatus for illuminating a mask having selected light absorbing regions and which mask is positioned against or adjacent to a photosensitive material to illuminate selected portions of the materials, comprising:

a light source means for producing light of a desired frequency range;

b first lens means for producing from light received from said source a region of substantially collimated light; and c second lens means for projecting an image of an imaginary surface in said region to illuminate said mask with light that is substantially non-collimated.

18. The method of projecting light to illuminate a mask having selected light absorbing regions and which mask is positioned against or adjacent to a photosensitive material to illuminate selected portions of the material, comprising projecting an image of an imaginary surface that is illuminated by substantially collimated light to illuminate the mask with light that is substantially non-collimated.

* * * * *